United States Patent [19]
Wong et al.

[11] Patent Number: 5,748,019
[45] Date of Patent: May 5, 1998

[54] OUTPUT BUFFER DRIVER WITH LOAD COMPENSATION

[75] Inventors: Belle Wong; Donald Lee; Derwin Mattos, all of San Jose, Calif.

[73] Assignee: VLSI Technology, Inc., San Jose, Calif.

[21] Appl. No.: 856,973

[22] Filed: May 15, 1997

[51] Int. Cl.$^6$ .................................................. H03K 5/12
[52] U.S. Cl. ........................ 327/170; 327/112; 327/333; 327/437; 326/83
[58] Field of Search .................................. 327/108, 112, 327/170, 333, 362, 363, 378, 389–391, 427, 434, 436, 437; 326/82, 83, 86, 87, 88

[56] References Cited

U.S. PATENT DOCUMENTS

| | | | |
|---|---|---|---|
| 4,542,310 | 9/1985 | Ellis et al. | 327/112 |
| 5,051,625 | 9/1991 | Ikeda et al. | 326/86 |

*Primary Examiner*—Kenneth B. Wells
*Attorney, Agent, or Firm*—Douglas L. Weller

[57] ABSTRACT

A circuit for producing a buffered output includes a power source, a ground, a circuit input, a circuit output, a voltage reference source, a current control pre-driver and an output driver. The circuit input receives an input signal. The circuit output produces an output signal. The voltage reference source generates a reference voltage. The current control pre-driver includes a first current source, a second current source, and control logic. The first current source is connected to the power source and has a first control input. The second current source is connected to the ground and has a second control input. The control logic is connected to the circuit input, to the voltage reference source, to the first control input of the first current source and to the second control input of the second current source. In response to a first voltage value of the input signal on the circuit input, the control logic turns off the second current source and turns on the first current source. The first current source is turned on by connecting the reference voltage to the first control input of the first current source. In response to a second voltage value of the input signal on the circuit input, the control logic turns off the first current source and turns on the second current source. The second current source is turned on by connecting the reference voltage to the second control input of the second current source. The output driver includes driver circuitry and a feedback capacitance. The driver circuitry is connected to the circuit output. The feedback capacitance includes a first end and a second end. The first end is connected to the first current source and to the second current source. The second end is connected to the circuit output.

8 Claims, 4 Drawing Sheets

5,748,019

1

OUTPUT BUFFER DRIVER WITH LOAD COMPENSATION

BACKGROUND

The present invention concerns integrated circuit design and pertains particularly to a design for an output buffer driver which generates current to compensate for variations in output load driven by the output buffer.

Integrated circuits generally use specially designed drivers in order to provide sufficient output current. Conventional output buffer drivers for integrated circuit manufactured using complement metal oxide semiconductor (CMOS) technology typically have rise and fall time and propagation delay which are heavily dependent upon the capacitive load on an output node, or output pad. For example, Equation 1 below represents typical approximation of the rise and fall time across a typical output buffer driver as well as the propagation time through the typical output buffer driver.

Equation 1

$$t_{rf} = 3.7 * C_l / (k * Vdd)$$

$$t_p = t_{int} + r_f * C_l$$

In Equation 1 above, "$t_{rf}$" is the rise or fall time across the output buffer driver. "$C_l$" is the capacitive load driven by the output buffer driver. "k" is a constant associated with the transistors used to construct the output buffer driver. "Vdd" is the voltage generated by the power supply for the output buffer driver. "$t_p$" is the propagation delay through the output buffer driver. "$t_{int}$" is the intrinsic delay though the output buffer driver. "$r_f$" is the capacitive ramp factor for the output buffer driver.

As is brought out by Equation 1, the rise and fall time is, at least approximately, proportional to the capacitive load driven by the output buffer. Likewise, the propagation delay, at least approximately, varies proportional to the capacitive load driven by the output buffer.

However, some applications, for example implementing a Universal Serial Bus (USB), require that the rise and fall time and propagation delay of a driver be insensitive to the output capacitive load. For such applications, conventional output buffer drivers for integrated circuit manufactured using CMOS technology are not usable because, as stated above, output buffer drivers for integrated circuit manufactured using CMOS technology typically have rise and fall time as well as propagation delay which are dependent upon the capacitive load.

SUMMARY OF THE INVENTION

In accordance with the preferred embodiment of the present invention, a circuit is presented for producing a buffered output. The circuit includes a power source, a ground, a circuit input, a circuit output, a voltage reference source, a current control pre-driver and an output driver. The circuit input receives an input signal. The circuit output produces an output signal. The voltage reference source generates a reference voltage. For example, the voltage reference source is implemented as a voltage divider.

The current control pre-driver includes a first current source, a second current source, and control logic. The first current source is connected to the power source and has a first control input. The second current source is connected to the ground and has a second control input. For example, the first current source and the second current source are each implemented as a transistor.

The control logic is connected to the circuit input, to the voltage reference source, to the first control input of the first current source and to the second control input of the second current source. In response to a first voltage value of the input signal on the circuit input, the control logic turns off the second current source and turns on the first current source. The first current source is turned on by connecting the reference voltage to the first control input of the first current source. In response to a second voltage value of the input signal on the circuit input, the control logic turns off the first current source and turns on the second current source. The second current source is turned on by connecting the reference voltage to the second control input of the second current source.

For example, the control logic is implemented using four transistors. A first transistor is connected between the power source and a gate of the first current source. A second transistor is connected between the gate of the first current source and the voltage reference source. A third transistor is connected between the voltage reference source and a gate of the second current source. A fourth transistor is connected between the gate of the second current source and the ground. A gate of the first transistor, a gate of the second transistor, a gate of the third transistor, and a gate of the fourth transistor are all controlled by the input signal on the circuit input.

In response to the first voltage value of the input signal on the circuit input, the first transistor electrically isolates the gate of the first current source from the power source, the second transistor electrically connects the gate of the first current source to the voltage reference source, the third transistor electrically isolates the gate of the second current source from the voltage reference source, and the fourth transistor electrically connects the gate of the second current source to the ground. In response to the second voltage value of the input signal on the circuit input, the first transistor electrically connect the gate of the first current source from the power source, the second transistor electrically isolates the gate of the first current source from the voltage reference source, the third transistor electrically connects the gate of the second current source to the voltage reference source, and the fourth transistor electrically isolates the gate of the second current source from the ground.

The output driver includes driver circuitry and a feedback capacitance. The driver circuitry is connected to the circuit output. The feedback capacitance includes a first end and a second end. The first end is connected to the first current source and to the second current source. The second end is connected to the circuit output.

For example, the driver circuitry is implemented using two transistors. A first transistor is connected between the power source and the circuit output. The first transistor has a gate which is connected to the first end of the feedback capacitance. A second transistor is connected between the ground and the circuit output. The second transistor has a gate which is connected to the first end of the feedback capacitance.

In one embodiment of the present invention, output enable/disable circuitry is connected to the output driver. The output enable/disable circuitry enables and disables the circuit in response to an enable/disable signal.

The present invention provides for implementation of an output buffer driver for an integrated circuit manufactured using CMOS technology which has a rise and fall time as

DESCRIPTION OF THE PRIOR ART

Figure 1:
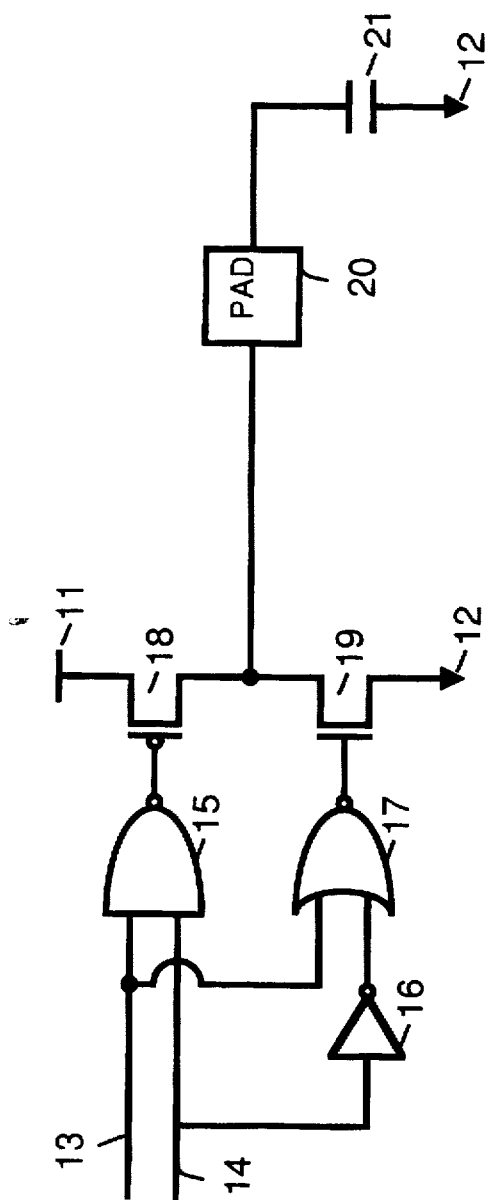
FIG. 1 shows a schematic for an output load buffer driver according to the prior art.

FIG. 1 shows a schematic for an output load buffer driver. An input signal is placed on an input line 13. An output enable signal is placed on an output enable line 14. A logic NOT gate 16 a logic NAND gate 15 and a logic NOR gate 17 are used to implement enabling and disabling the output signal. A transistor 18 and a transistor 19, connected between a power supply 11 and a reference voltage 12, are used to drive the output signal onto a pad 20. Power supply 12 supplies a power voltage (Vdd) for the output load buffer driver. A capacitor 21 represents the capacitive load ($C_l$) for the output signal.

As indicated above, Equation 1 represents a typical approximation of the rise and fall time across the output load buffer driver shown in FIG. 1 as well as the propagation time through the output load buffer driver shown in FIG. 1.

In Equation 1 above, "$t_{r,f}$" is the rise or fall time across the output load buffer driver. "$C_l$" is the capacitive load represented by capacitor 21. "k" is a constant associated with transistors 18 and 19. "Vdd" is the voltage generated by power supply 11. "$t_p$" is the propagation delay through the output load buffer driver. "$t_{int}$" is the intrinsic delay though the output load buffer driver. "$r_f$" is the capacitive ramp factor for the output load buffer driver.

As is brought out by Equation 1, the rise and fall time is, at least approximately, proportional to the capacitive load represented by capacitor 21. Likewise, the propagation delay is, at least approximately, varies proportional to the capacitive load represented by capacitor 21.

Description of the Preferred Embodiment

Figure 2:
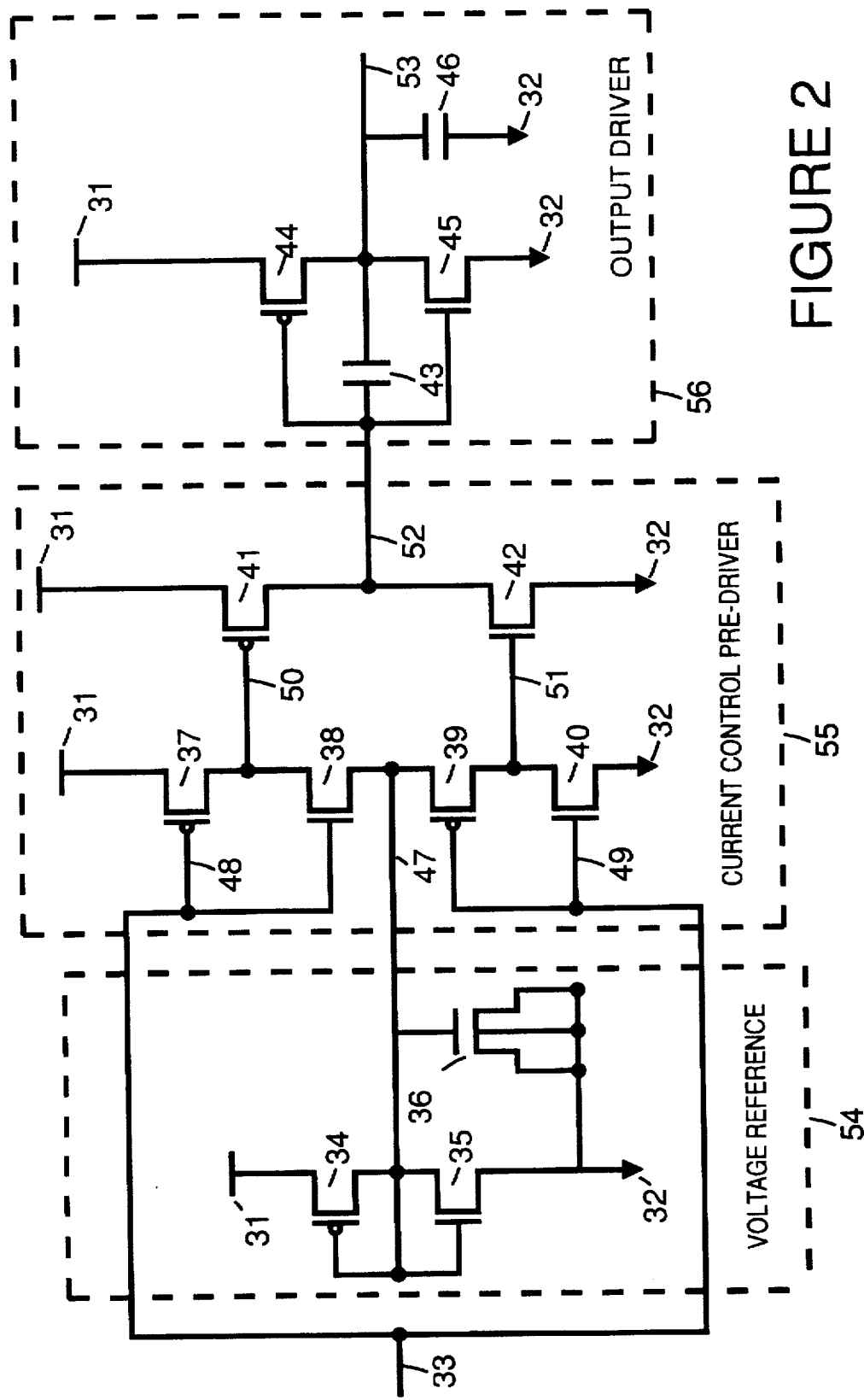
FIG. 2 shows a schematic for an output load buffer driver in accordance with a preferred embodiment of the present invention.

FIG. 2 shows a schematic for an output load buffer driver in accordance with a preferred embodiment of the present invention.

A voltage reference circuit 54 provides a constant voltage to be used by current sources within a current control pre-driver circuit 55. Voltage reference circuit 54 includes a transistor 34, a transistor 35 and a transistor 36. A power source 31 supplies a power voltage (Vdd) signal, and a ground 32 supplies a ground signal. A node reference voltage at a node 47 is generated by the voltage divider created by transistor 34 and transistor 35. Transistor 36 is used as a capacitor to stabilize the node reference voltage at node 47. For example, the node reference voltage at node 47 is one half the voltage of the power voltage signal (Vdd) when transistors 34 and 35 are sized equally.

While FIG. 2 shows voltage reference circuit 54 implemented using a voltage divider, other implementations would work equally as well. For example, voltage reference circuit 54 could be implemented using a bandgap voltage reference circuit.

Current control pre-driver circuit 55 provides a constant current source or sink to control an output driver circuit 56. Current control pre-driver circuit 55 contains a pair of switchable current sources capable of charging and discharging a control node 52 for output driver circuit 56. Current control pre-driver circuit 55 includes a transistor 37, a transistor 38, a transistor 39, a transistor 40, a transistor 41 and a transistor 42.

Current control pre-driver circuit 55 is controlled by an input signal on a circuit input line 33. When the input signal on circuit input line 33 is high (i.e., at a logic 1 value equivalent to the voltage of Vdd), the node reference voltage at node 47 is passed to reference node 50 and reference node 51 is pulled to ground. When the input signal on circuit input line 33 is low (i.e., at a logic 0 value equivalent to the voltage of ground), the node reference voltage at node 47 is passed to reference node 50 and reference node 51 is pulled to Vdd.

When the input signal on circuit input line 33 transitions from low to high, the node reference voltage at node 47 will pass through transistor 38 to a reference node 50 and transistor 40 will pull a reference node 51 to ground. With these values transistor 41 will act as a current source to charge up control node 52 and transistor 42 will be turned off.

When the input signal on circuit input line 33 transitions from high to low, the node reference voltage at node 47 will pass through transistor 39 to reference node 51 and transistor 37 will pull node reference node 50 to Vdd. With these values, transistor 42 will act as a current sink to discharge control node 52 and transistor 41 will be turned off. In this way current control pre-driver circuit 55 provides the logic to turn on and off the current sources to charge and discharge control node 52.

Output driver circuit 56 provides current to drive voltage on circuit output 53 to the desired level. A feedback capacitor 43 is used to sense the output loading capacitance, represented by capacitor 46. Output driver circuit 56 consists of a transistor 44, a transistor 45 and feedback capacitor 43. The output loading capacitance, represented by capacitor 46, is sensed by measuring the current through feedback capacitor 43.

Figure 3:
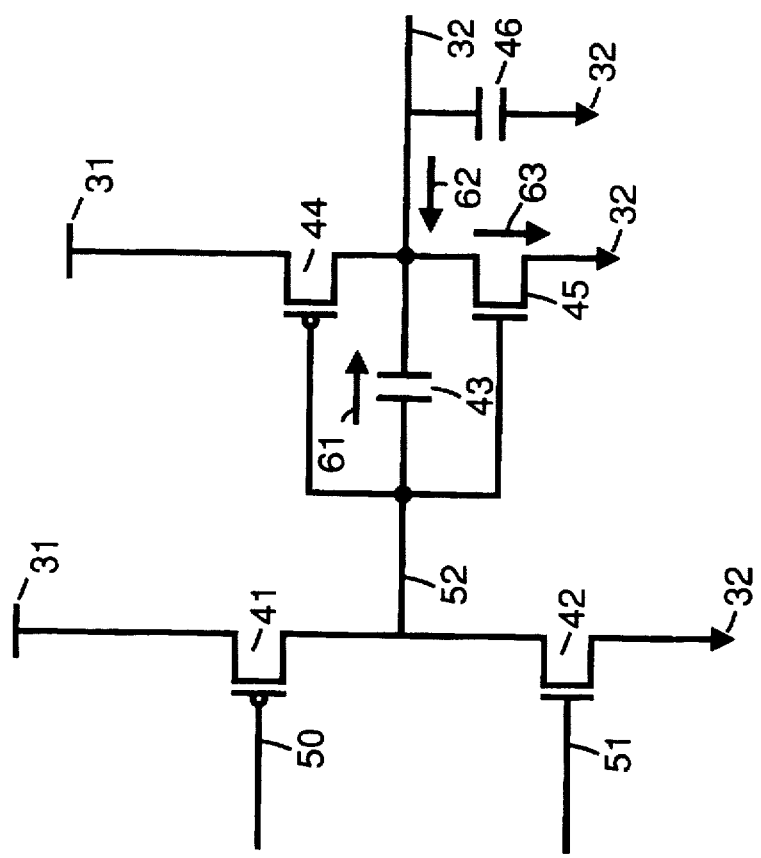
FIG. 3 illustrates current flow within an output driver for the output load buffer driver shown in FIG. 2 in accordance with a preferred embodiment of the present invention.

FIG. 3 illustrates current flow within output driver circuit 56 in order to explain operation of feedback capacitor 43. For Equations 2 below, a current through feedback capacitor 43 is represented by the symbol $I_c$. A current through load capacitor 46 is represented by the symbol $I_l$. A current 63 through transistor 45 is represented by the symbol $I_r$. A capacitance across feedback capacitor 43 is represented by the symbol $C_c$. A capacitance across load capacitor 46 is represented by the symbol $C_l$. A voltage across feedback capacitor 43 is represented by the symbol $V_c$. A voltage across load capacitor 46 is represented by the symbol $V_l$.

Equations 2 below illustrate that as the capacitance ($C_l$) across load capacitor 46 increases, the current ($I_c$) through feed back capacitor 43 decreases and the voltage at control node 52 increases.

Equations 2

$I_r = I_c + I_l$ $I_c = C_c * (VD_c/dt)$ $I_l = C_l * (VD_l/dt)$ $$I_l/C_c = I_l/C_l$$

$$I_t = I_c + (C_l/C_c)*I_c$$

$$I_t = I_c*(1+C_l/C_c)$$

$$I_c = I_t*(C_c/(C_c+C_l))$$

Equations 2 above demonstrate that for the load buffer driver shown in FIG. 2, as the output loading capacitance, represented by capacitor 46, increases, the current through feedback capacitor 43 decreases. For the case when the voltage on circuit output 53 is to be driven low, the transistor 44 turns on and transistor 45 turns off. Transistor 44 starts to charge control node 52 control node 52 high and out transistor 45 turns on. Transistor 45 provides a current source to discharge the voltage on circuit output 53.

The current ($I_t$) through transistor 45, is shared between feedback capacitor 43 and the load capacitor 46. If load capacitor 46 is larger, the current ($I_l$) through load capacitor 46 will increase which in turn decreases the current ($I_c$) through feedback capacitor 43. Giving less current ($I_c$) through feedback capacitor 43, the current source from transistor 41 will increase the voltage on control node 52. This increase in voltage will turn transistor 45 on harder and provide more current to compensate for the increase in output capacitance loading.

If load capacitor 46 is smaller, the current ($I_l$) through transistor 45 will decrease and the current ($I_c$) through feedback capacitor 43 will increase. This increase in current ($I_c$) through feedback capacitor 43 will take a bigger fraction away from the current supplied by transistor 41 and hence the voltage at control node 52 will decrease. The drive of output transistor 45 will be weaker which will compensate for the decrease in output capacitance loading.

For the case when the voltage on circuit output 53 is to be driven high, functionality is similar to the case when the voltage on circuit output 53 is to be driven low, except however, that when the voltage on circuit output 53 is to be driven high, output transistor 44 turns on and transistor 42 will supply the current. This is contrasted with the case when the voltage on circuit output 53 is to be driven low where transistor 45 turns on and transistor 41 supplies the current.

Figure 4:
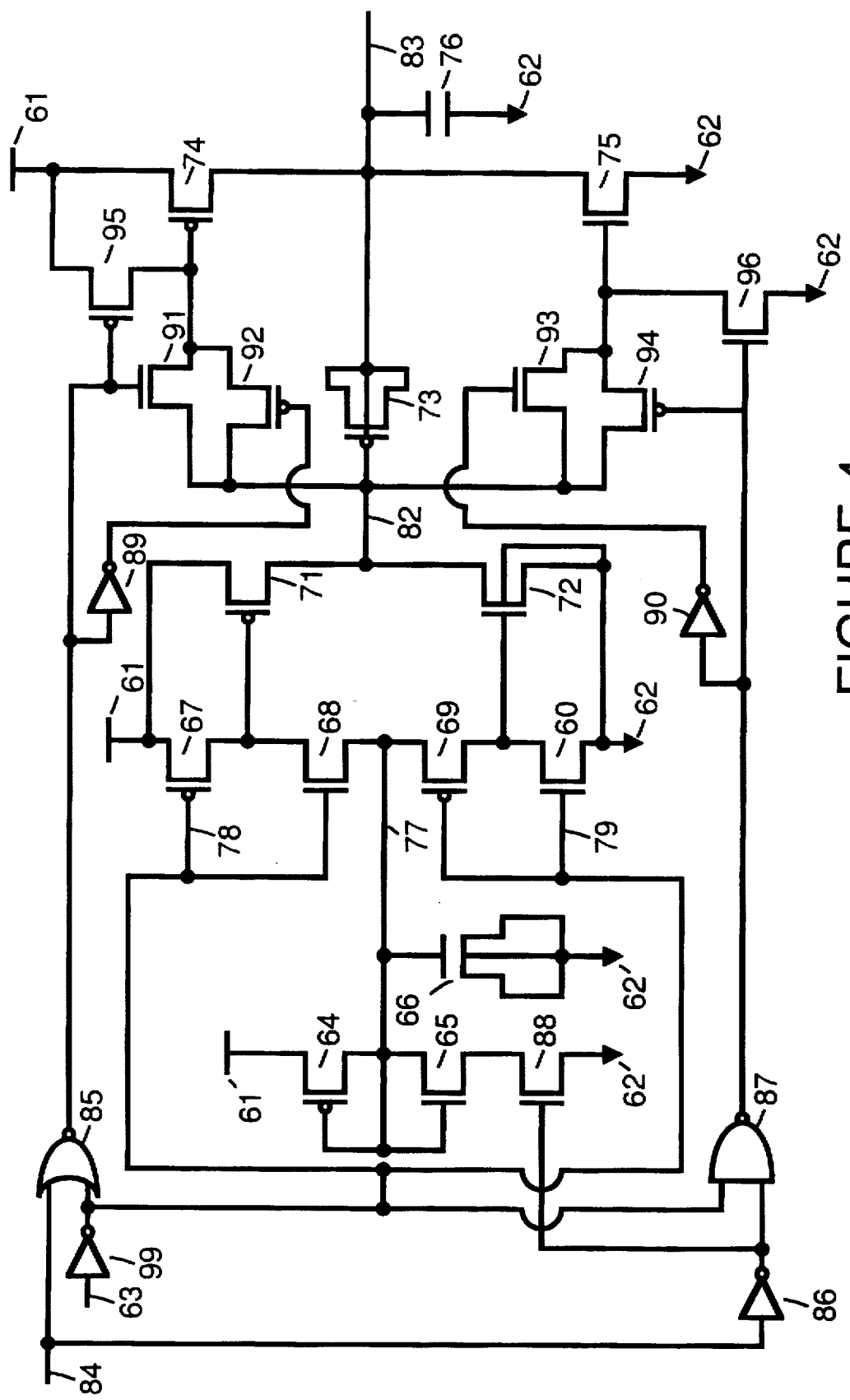
FIG. 4 shows a schematic for an output load buffer driver with an output enable in accordance with a preferred embodiment of the present invention.

FIG. 4 shows a schematic for an output load buffer driver which contains output enabling/disabling functionality and also provides a zero current state when the output is disabled.

A voltage reference portion provides a constant voltage to be used by current sources within a current control pre-driver portion. The voltage reference portion includes a transistor 64, a transistor 65 and a transistor 66. A power source 61 supplies a power voltage (Vdd) signal, and a reference voltage source 62 supplies a ground signal. A node reference voltage at a node 77 is generated by the voltage divider created by transistor 64 and transistor 65. Transistor 66 is used as a capacitor to stabilize the ode reference voltage at node 77. For example the node reference voltage at ode 77 is one half the voltage of the power voltage signal (Vdd).

While FIG. 4 shows the voltage reference portion implemented using a voltage divider, other implementations would work equally as well. For example, the voltage reference portion could be implemented using a bandgap voltage reference circuit.

The current control pre-driver portion provides a constant current source or sink to control an output driver portion. Current control pre-driver portion contains a pair of switchable current sources capable of charging and discharging a control node 82 for the output driver portion. The current control pre-driver portion includes a transistor 67, a transistor 68, a transistor 69, a transistor 70, a transistor 71 and a transistor 72. The current control pre-driver is controlled by an input signal on a circuit input line 63, which is connected to logic NOT gate 99.

The output driver portion provides current to drive voltage on circuit output 83 to the desired level. A transistor 73 is used as a feedback capacitor in order to sense the output loading capacitance, represented by capacitor 76. The output driver portion consists of a transistor 74, a transistor 75 and transistor 73. The output loading capacitance, represented by capacitor 76, is sensed by measuring the current through transistor 73.

Additional circuitry has been added to implement output enabling/disabling functionality and also to provide for a zero current state when the output is disabled. The added circuitry incudes an output enable line 84, a logic NOR gate 85, a logic NOT gate 86, a logic NAND gate 87, a transistor 88, a logic NOT gate 89, a logic NOT gate 90, a transistor 91, a transistor 92, a transistor 93, a transistor 94, a transistor 95 and a transistor 96.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A circuit for producing a buffered output, comprising:
   a power source;
   a ground;
   a circuit input for receiving an input signal;
   a circuit output for producing an output signal;
   a voltage reference source for generating a reference voltage;
   a current control pre-driver, including:
      a first current source, coupled to the power source, the first current source having a first control input,
      a second current source, coupled to the ground, the second current source having a second control input, and,
      control logic, coupled to the circuit input, to the voltage reference source, to the first control input of the first current source and to the second control input of the second current source, the control logic,
         in response to a first voltage value of the input signal on the circuit input, turning off the second current source and turning on the first current source by coupling the reference voltage to the first control input of the first current source, and
         in response to a second voltage value of the input signal on the circuit input, turning off the first current source and turning on the second current source by coupling the reference voltage to the second control input of the second current source; and,
   an output driver comprising:
      driver circuitry coupled to the circuit output, and
      feedback capacitance, including,
         a first end coupled to the first current source and to the second current source, and,
         a second end coupled to the circuit output.

2. A circuit as in claim 1 wherein the voltage reference source comprises a voltage divider.

3. A circuit as in claim 1 wherein the first current source comprises a first transistor and the second current source comprises a second transistor.

4. A circuit as in claim 3 wherein the control logic comprises:
- a third transistor coupled between the power source and a gate of the first transistor;
- a fourth transistor coupled between the gate of the first transistor and the voltage reference source;
- a fifth transistor coupled between the voltage reference source and a gate of the second transistor; and,
- a fifth transistor coupled between the gate of the second transistor and the ground;
- wherein a gate of the third transistor, a gate of the fourth transistor, a gate of the fifth transistor, a gate of the sixth transistor are all controlled by the input signal on the circuit input.

5. A circuit as in claim 4 wherein:
in response to the first voltage value of the input signal on the circuit input:
- the third transistor electrically isolates the gate of the first transistor from the power source,
- the fourth transistor electrically connects the gate of the first transistor to the voltage reference source,
- the fifth transistor electrically isolates the gate of the second transistor from the voltage reference source, and
- the sixth transistor electrically connects the gate of the second transistor to the ground; and, in response to the second voltage value of the input signal on the circuit input:
- the third transistor electrically connects the gate of the first transistor from the power source,
- the fourth transistor electrically isolates the gate of the first transistor from the voltage reference source,
- the fifth transistor electrically connects the gate of the second transistor to the voltage reference source, and
- the sixth transistor electrically isolates the gate of the second transistor from the ground.

6. A circuit as in claim 5 wherein the driver circuitry comprises:
- a seventh transistor coupled between the power source and the circuit output, the seventh transistor having a gate which is coupled to the first end of the feedback capacitance; and,
- an eighth transistor coupled between the ground and the circuit output, the eighth transistor having a gate which is coupled to the first end of the feedback capacitance.

7. A circuit as in claim 1 wherein the driver circuitry comprises:
- a first transistor coupled between the power source and the circuit output, the first transistor having a gate which is coupled to the first end of the feedback capacitance; and,
- a second transistor coupled between the ground and the circuit output, the second transistor having a gate which is coupled to the first end of the feedback capacitance.

8. A circuit as in claim 1, additionally comprising output enable/disable circuitry, coupled to the output driver, for enabling and disabling the circuit in response to an enable/disable signal.

* * * * *